(12) United States Patent
Hammond, IV et al.

(10) Patent No.: US 11,626,853 B2
(45) Date of Patent: Apr. 11, 2023

(54) RF POWER DELIVERY ARCHITECTURE WITH SWITCHABLE MATCH AND FREQUENCY TUNING

(71) Applicant: Applied Materials, Inc., Santa Clara, CA (US)

(72) Inventors: Edward P. Hammond, IV, Hillsborough, CA (US); Yury Trachuk, Fort Collins, CO (US); Dmitry A. Dzilno, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/169,220

(22) Filed: Feb. 5, 2021

(65) Prior Publication Data
US 2022/0255525 A1   Aug. 11, 2022

(51) Int. Cl.
*H03H 7/38*    (2006.01)
*G05F 1/12*    (2006.01)
(Continued)

(52) U.S. Cl.
CPC .............. *H03H 7/38* (2013.01); *G05F 1/12* (2013.01); *H01J 37/32174* (2013.01);
(Continued)

(58) Field of Classification Search
CPC ............ H03H 7/38; H03H 7/383; H03H 7/40; H03H 9/0004; H03H 11/28; H03H 11/30;
(Continued)

(56) References Cited

U.S. PATENT DOCUMENTS 7,109,457 B2   9/2006   Kinzer
9,595,423 B2   3/2017   Leray et al.
(Continued)

FOREIGN PATENT DOCUMENTS

JP   5972908 B2    8/2016
JP   2020092036 A  6/2020
(Continued)

OTHER PUBLICATIONS

PCT/US2022/015099, International Search Report and Written Opinion dated May 23, 2022, 10 pages.

*Primary Examiner* — Long Nguyen
(74) *Attorney, Agent, or Firm* — Patterson + Sheridan, LLP

(57) ABSTRACT

A power supply circuit includes a switchable match, including a high voltage bus connectable to a load, a low voltage bus connectable to the load such that the load is in series between the high voltage bus and the low voltage bus, at least two capacitors having a fixed value of capacitance selectively connectable between the high voltage bus and the low voltage bus and a plurality of solid state switches equal in number to the number of capacitors having a fixed value of capacitance connectable between the high voltage bus and the low voltage bus, each switch configured and arranged to selectively connect or disconnect one of the capacitors having a fixed value of capacitance selectively connectable between the high voltage bus and the low voltage bus into electrical communication between the high voltage bus and the low voltage bus, and a variable frequency power supply including a high voltage output connection, the high voltage connection connected to the high voltage bus.

16 Claims, 10 Drawing Sheets

(51) Int. Cl.
  *H03F 3/19*   (2006.01)
  *H01J 37/32*  (2006.01)
  *H03H 9/00*   (2006.01)

(52) U.S. Cl.
  CPC .......... *H01J 37/32183* (2013.01); *H03F 3/19* (2013.01); *H03H 9/0004* (2013.01)

(58) Field of Classification Search
  CPC . H01J 37/32174; H01J 37/32183; H03F 3/19; G05F 1/12
  See application file for complete search history.

(56) References Cited

U.S. PATENT DOCUMENTS

| | | | |
|---|---|---|---|
| 9,601,261 B2* | 3/2017 | Schatz | H02J 50/90 |
| 10,263,594 B2 | 4/2019 | Lyalin et al. | |
| 2011/0002080 A1* | 1/2011 | Ranta | H03H 11/28 |
| | | | 361/277 |
| 2012/0168081 A1* | 7/2012 | Son | H01G 5/16 |
| | | | 156/345.28 |
| 2015/0310995 A1* | 10/2015 | Ranta | H01L 23/5223 |
| | | | 361/281 |
| 2019/0272978 A1 | 9/2019 | Ahmed et al. | |
| 2020/0411288 A1 | 12/2020 | Wang et al. | |

FOREIGN PATENT DOCUMENTS

| | | |
|---|---|---|
| KR | 101619871 B1 | 5/2016 |
| KR | 20170103901 A | 9/2017 |
| TW | 201417138 A | 5/2014 |

\* cited by examiner

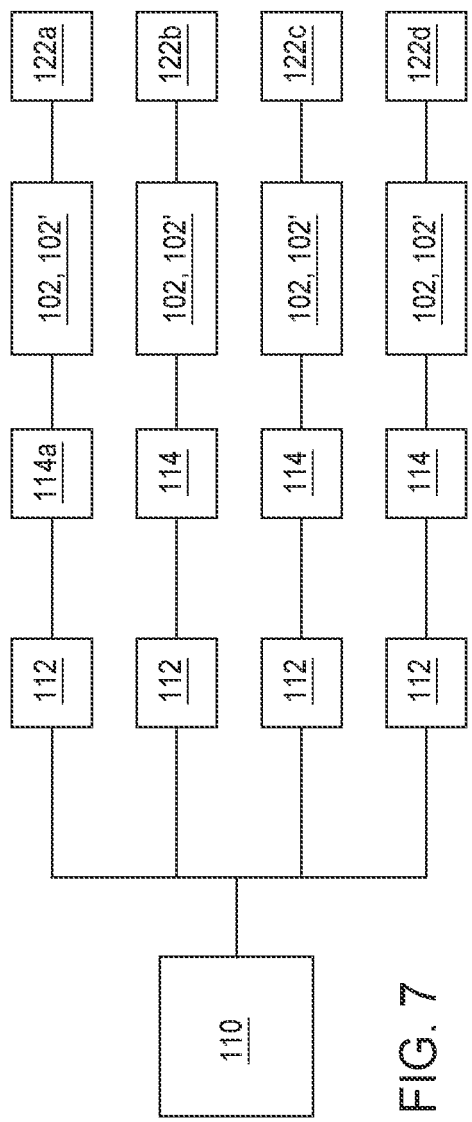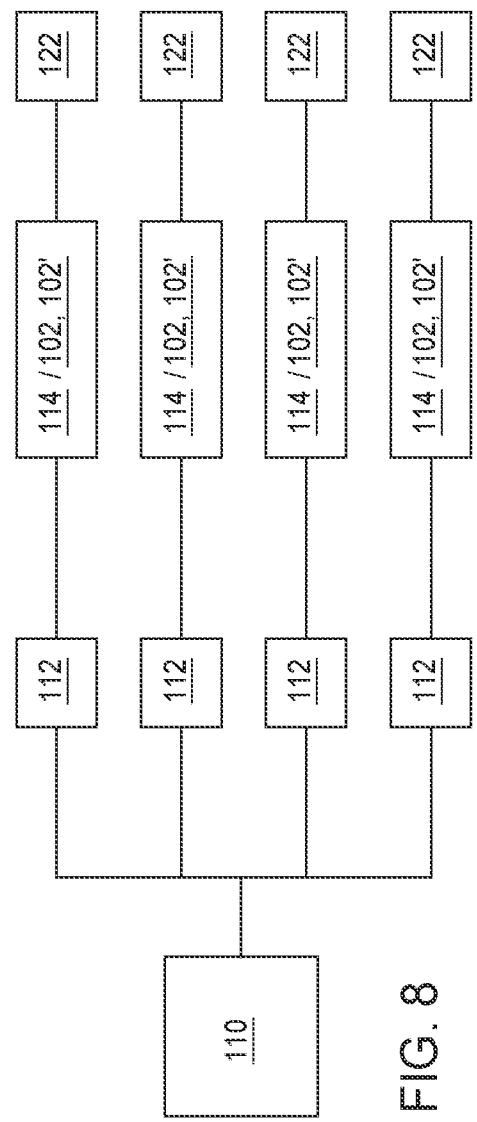

RF POWER DELIVERY ARCHITECTURE WITH SWITCHABLE MATCH AND FREQUENCY TUNING

BACKGROUND

Field

Embodiments of the present invention generally relate to a match circuit located between a source of alternating current power, for example a source of RF frequency power, and a load such as a semiconductor or other processing chamber. This includes a processing chamber where the load includes an AC powered element, or an AC powered element coupled to a plasma within the chamber. More particularly, the embodiments herein relate to methods and apparatus for providing a match between a power supply and a load, where the characteristics of the load dynamically change, and where the match can effectively switch between match circuit elements while power is supplied to the load, and the frequency of the alternating current power signal is likewise dynamically changeable, to enable minimal power reflectance from the load as the load characteristic change under power application thereto.

Description of the Related Art

There are known in the match art matches employing variable capacitors, wherein the capacitor has a range of capacitance values, and different values of capacitance are selected by physically changing characteristics of the capacitor, such as by application of motor torque to a shaft connected to the variable capacitor, to change the capacitance value thereof. These motorized capacitors have a limited lifetime, and are relatively slow to respond to changes in the load characteristics requiring a change in a capacitance value in the match. Additionally, where a fixed value of components of the match are disposed between a power supply and a load, it is known to use a variable frequency power supply, wherein slight changes in load characteristics which affect the matching of the power supply to the load can be addresses by changing the frequency of the power signal to the match. However, the range of variation of the output frequency is limited, and cannot fully address issues, which arise when the load characteristics change and the load begins reflecting power, or the amount of reflected power as compared to the forward power delivered by the power supply increases significantly.

SUMMARY

Provided herein is a power supply circuit including a match. In one aspect, a power supply circuit includes a switchable match, including a high voltage bus connectable to a load, a low voltage bus connectable to the load such that the load is in series between the high voltage bus and the low voltage bus, at least two capacitors having a fixed value of capacitance selectively connectable between the high voltage bus and the low voltage bus and a plurality of solid state switches equal in number to the number of capacitors having a fixed value of capacitance connectable between the high voltage bus and the low voltage bus, each switch configured and arranged to selectively connect or disconnect one of the capacitors having a fixed value of capacitance selectively connectable between the high voltage bus and the low voltage bus into electrical communication between the high voltage bus and the low voltage bus, and a variable frequency power supply including a high voltage output connection, the high voltage connection connected to the high voltage bus.

In another aspect, provided herein is a match connectable between a variable frequency power supply and a load, wherein the electrical characteristics of the load can dynamically change, including a high voltage bus connectable to a load, a low voltage bus connectable to the load such that the load is in series between the high voltage bus and the low voltage bus, at least two capacitors having a fixed value of capacitance selectively connectable between the high voltage bus and the low voltage bus, and a plurality of solid state switches equal in number to the number of capacitors having a fixed value of capacitance connectable between the high voltage bus and the low voltage bus, each switch configured and arranged to selectively connect or disconnect one of the capacitors having a fixed value of capacitance selectively connectable between the high voltage bus and the low voltage bus into electrical communication between the high voltage bus and the low voltage bus.

Further, a method of matching a power supply to a load, wherein the power supply is a variable frequency power supply, includes providing a power supply circuit, including a switchable match configured to change the electrical characteristics thereof in response to changes in a load to which the switchable match is connected, includes providing a high voltage bus connectable to a load, a low voltage bus connectable to the load such that the load is in series between the high voltage bus and the low voltage bus, at least two capacitors having a fixed value of capacitance selectively connectable between the high voltage bus and the low voltage bus, and a plurality of solid state switches equal in number to the number of capacitors having a fixed value of capacitance connectable between the high voltage bus and the low voltage bus, each switch configured and arranged to selectively connect or disconnect one of the capacitors having a fixed value of capacitance selectively connectable between the high voltage bus and the low voltage bus into electrical communication between the high voltage bus and the low voltage bus, and providing a variable frequency power supply including a high voltage output connection, the high voltage connection connected to the high voltage bus.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 7 is a schematic circuit showing a single DC power supply configured to supply power to a number of individual sets of DC to AC convertors, RF amplifiers, and match circuits, each set of a DC to AC convertor, RF amplifier, and match circuit coupled to a dedicated load thereto.

FIG. 8 is a schematic circuit showing a single DC power supply configured to supply power to a number of individual sets of DC to AC convertors, RF amplifiers, and match circuits, each set of a DC to AC convertor, RF amplifier, and match circuit coupled to a dedicated load thereto.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
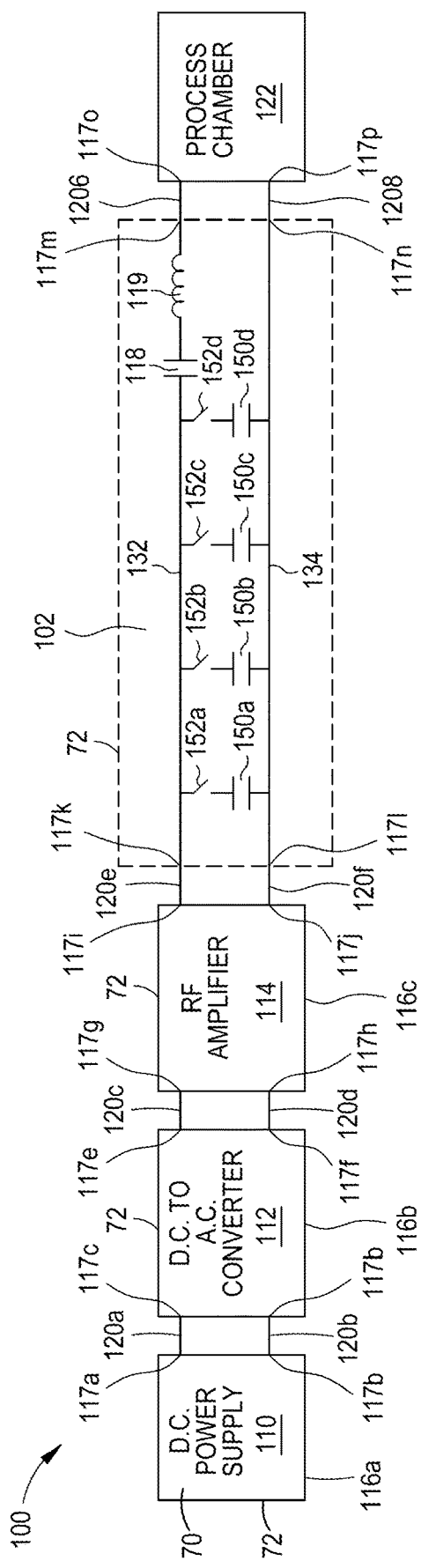
FIG. 1 is a plan view of a plasma power supply circuit, including a switchable match, a AC to DC converter, and an RF amplifier, the switchable match contained in a box shell different from that of a, a AC to DC converter, and an RF amplifier, for supply of a RF power signal matched to the changing electrical characteristics of a process chamber.

Provided herein is an alternating current, for example AC or RF power delivery architecture, including both a switchable match and frequency tuning for providing power to a plasma chamber at a consistent rate despite changes in the electrical characteristics of a load coupled thereto. Here, for example, the electrical characteristics of the switchable match change to address changes in the electrical reactance and resistance of a chamber component to which the power supply is coupled, or in a plasma and return or ground bath thereof, or changes in the electrical characteristics of the series connection of the component, the plasma, and the ground or return path. By appropriate connection of individual components of the switchable match into the active match circuit thereof, the electrical characteristics of the switchable match can be changed to more closely match the electrical characteristics of the circuit components upstream thereof to the reactance of the components downstream thereof, i.e., of a load composed of the chamber components to which it is coupled, the plasma in the chamber, or both. The selective connection of match components into the match circuit results in a match, or a near match, of the downstream load reactance. By additionally adjusting the frequency of the RF signal reaching the match, a matching reactance, or a reactance very close to matching, the reactance downstream thereof can be achieved.

Here, the individual components which are selectively included in the match circuit are individual capacitors, located between the power and ground lines or buses of the match, i.e., provided as "shunt" capacitors, and one or more of these capacitors can be selectively incorporated into the match circuit using a solid state switch dedicated thereto and located in series with each capacitor between the power and return or ground buses of the match. Herein, descriptions of a switchable L configuration match and a switchable π configuration match are described. Each such switchable match is configurable to be located in series between either an RF generator and appropriate power supply and return path cabling and a process chamber or component thereof, or between a D.C. power supply, DC to AC converter and an RF amplifier and a process chamber or component thereof. Additionally, with respect to FIGS. 1 to 4, the RF power is supplied by individual components in discrete packagings or shell boxes, here a DC power supply 110 connected to a source of AC power, for example a fab or factory AC source at 200 to 480 V and sufficient wattage to power the DC power supply 110, a DC to AC (RF) converter 112, and an RF amplifier 114, whereas in FIGS. 5 and 6 the RF power is supplied by an integrated RF generator. In the configurations of FIGS. 1 to 4, a single DC power supply can be connected to multiple process chambers 122 through a switchable match 102 or 102' dedicated to each chamber, as is shown schematically in FIGS. 7 and 8. Additionally, the DC power supply, and the DC to AC convertor 112 (oscillator) and the RF or AC amplifier 114 can be configured in a single enclosure or shell box, as shown schematically in FIG. 12 hereof. In the aspect hereof shown in FIG. 1, a power supply circuit 100 including an L style switchable match circuit 102 is shown. In FIG. 2, the power supply circuit 100 is the same as that of FIG. 1, but the RF amplifier and switchable match are provided in the same shell box. In the aspect hereof shown in FIG. 3, a power supply circuit 100 including a π style switchable match 102' is shown. In FIG. 4, the power supply circuit 100 is the same as that of FIG. 3, but the RF amplifier 114 and switchable match 102' are provided in the same shell box.

Figure 2:
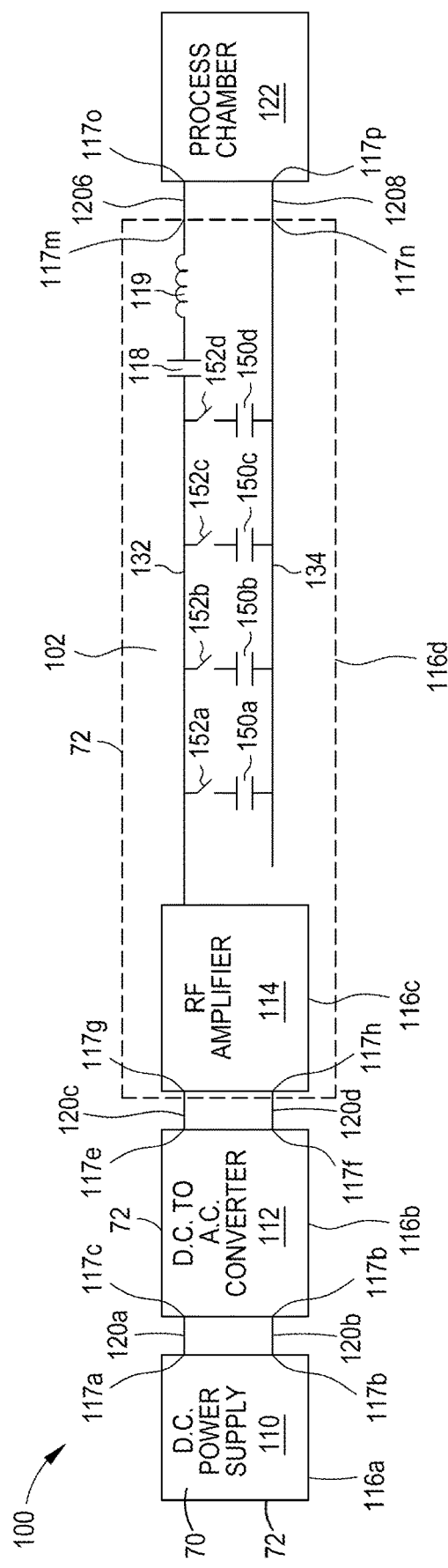
FIG. 2 is a plan view of a plasma power circuit, including a switchable match, a DC power supply, a DC to AC converter, and an RF amplifier, the switchable match disposed in a box shell shared with an RF amplifier, which is a separate box shell from that of a DC power supply and a DC to AC converter, for supply of a RF power signal matched to the changing electrical characteristics of a process chamber.

Referring initially to FIG. 1, an RF power delivery architecture device including a power supply circuit 100 including a switchable match 102 and frequency tuning able to provide power to a plasma chamber at a consistent rate despite changes in the electrical characteristics of the load connected thereto is depicted. Here, the load is a process chamber 122 component, the electrical characteristics of which change during the powering thereof, or a process chamber 122 component and a plasma electrically coupled thereto and to ground or a return path and in which the electrical characteristic change during the powering thereof, or combinations thereof. The power supply circuit 100 is here configured to enable connection of one or more switchable matches 102 to be connected thereto. For example, the power supply circuit 100 can be used to provide high RF power to a process chamber 122 or to a component or plasma thereof, with minimized reflected power despite changes in reactance in the process chamber 122 or component or plasma thereof connected to the switchable match 102, by using active solid state switching of switchable match 102 components into or out of the match circuit while under power, and if required, by adjusting the frequency of the RF signal.

As shown in FIG. 1, a power supply circuit 100 includes a series box shells 116 a-e, each shell comprising a steel or other metal frame 70, each configured as a rectangular prism bounded by skins 72 connected to the frame 70 by threaded fasteners or other securement elements to hold element so the power supply circuit therein as separate modules. Each box shell 116a-e includes at least two connectors 117 (connectors 117a-p of the several box shells 116 of FIG. 1) extending through the skins 72 to enable connection of the electrical component(s) within a shell a 116 to a component exterior thereto, or to a component in or on the plasma chamber. Connection cables 120, for example RF shielded cables, connect to each connector 117 to connect the electrical component in each shell 116 to another component in another shell 116 through a connector 117 thereof or to the process chamber 122 component.

In the embodiments hereof of FIGS. 1 to 4 where the power supply circuit 100 is configured of modular elements in box shells 116, a DC power supply 110 enclosed in box shell 116a supplies direct current electrical power to the power supply circuit 100. The DC power supply 110 is connected into the power supply circuit 100 by two connection cables 120a and 120b. Connection cable 120a is connected to the dc+ or DC high voltage side of the DC power supply 110 at connector 117a, and connection cable 120b is connected to the − or ground side of the DC power supply 110 at connector 117d.

The connection cables 120 a, b extend from the connectors 117a, b on the box shell 116a covering the DC power supply 110 respectively to the two input connectors 117c, d extending from the skins 72 in the box shell 116b covering the DC to AC converter 112. The DC to AC converter 112 converts the direct current electrical signal (power) received through the connection cables 120, b to alternating current using a solid-state oscillation circuit. Here, the AC output of the DC to AC converter 112 can be an RF frequency, i.e., 13.56 or multiples thereof, or another AC frequency. The output of the DC to AC converter 112 is connected to an RF (or AC) amplifier 114 through connection cables 120c, 120d. Connection cable 120c extends between an output connector 117e of the DC to AC converter 112 to the input connector 117g of the RF amplifier on the high voltage RF output side of the DC to AC converter 112, and connection cable 120d extends between return or ground connector 117f of the AC to DC converter and the return or ground connector 117h of the RF amplifier 114. The RF amplifier 114 is a solid state amplifier, connected to a power source such as a 220V or 44V exterior electrical connection (not shown), to increase the peak to peak voltage of the alternating current signal output by the DC to AC converter, to a value useful for the end application of the AC signal, for example for driving an electrode or coil in or over a plasma processing chamber as part of a plasma circuit within the chamber, or driving another component within the chamber which is not a direct part of the plasma circuit. For example, the output rms voltage may be on the order of 1000 V, more commonly 100 to 200V.

At the output side of the switchable match 102, connector 117m on the high voltage bus 132 is connected to the high voltage input connector 117o of the plasma chamber 122 to connect to a component thereof through a connection cable 1206, and connector 117n is connected the return path or ground bus 134 to the return or ground side connector 117p of the process chamber 122 through connection cable 1208.

In FIG. 1, the match is configured as an "L" match, wherein a first, variable, capacitance configured of up to four capacitors 150a-d is located between the high voltage bus 132 and return or ground bus 134, a second capacitance in the form of fixed capacitance capacitor 118, and an inductor 119, are located in series in the high voltage bus 132 between the connection of the variable capacitance therewith and the connector 117m.

Here, the shunt capacitance, i.e., the capacitance in the "L" circuit between the high voltage bus 132 and return or ground bus 134, is a variable capacitance configurable by, in this embodiment, four capacitors 150a-d each of which have a fixed capacitance value, and each is selectively connectable between or across the high voltage bus 132 and the return or ground bus 134 by the selective operation of the one of switches 152a-d connected between a capacitor 150 and the high voltage bus 132. A lesser number of shunt capacitors 150, but at least two shunt capacitors, or a greater number of shunt capacitors, may be employed, to enable the match designer to create a match with minimal ranges of load electrical conditions where power is reflected, by switching the shunt capacitors into or out of the match circuit. To enable matching across a large range of resistance and reactance in the load, one or more of the capacitors 150a-d can be switched into or out of the match circuit, i.e., connected between or across the high voltage bus 132 and the return or ground bus 134. Each of the capacitors 150a-d, when connected to the match circuit, are electrically in parallel with one another between or across the high voltage bus 132 and the return or ground bus 134. Additionally, the match designer can allow none of the capacitors 150a-d need to be connected between or across the high voltage bus 132 and the return or ground bus 134. Connection of any capacitor among capacitors 150a-d between or across the high voltage bus 132 and the return or ground bus 134 is created by closing the corresponding ones of the switches 150a-d present between a capacitor 150 a-d and the high voltage bus 132. Likewise, any capacitor among capacitors 150a-d can be disconnected as between or across the high voltage bus 132 and the return or ground bus 134 by opening the corresponding ones of the switches 150a-d present between a capacitor 150 a-d and the high voltage bus 132. Here, the switches 152a-d are solid state switches, for example PIN diodes, which can be switched under power, i.e., to connect or disconnect a capacitor connected thereto into or out of the match circuit while power is passing through switchable match 102 and into the process chamber 122 or a component thereof.

Figure 9:
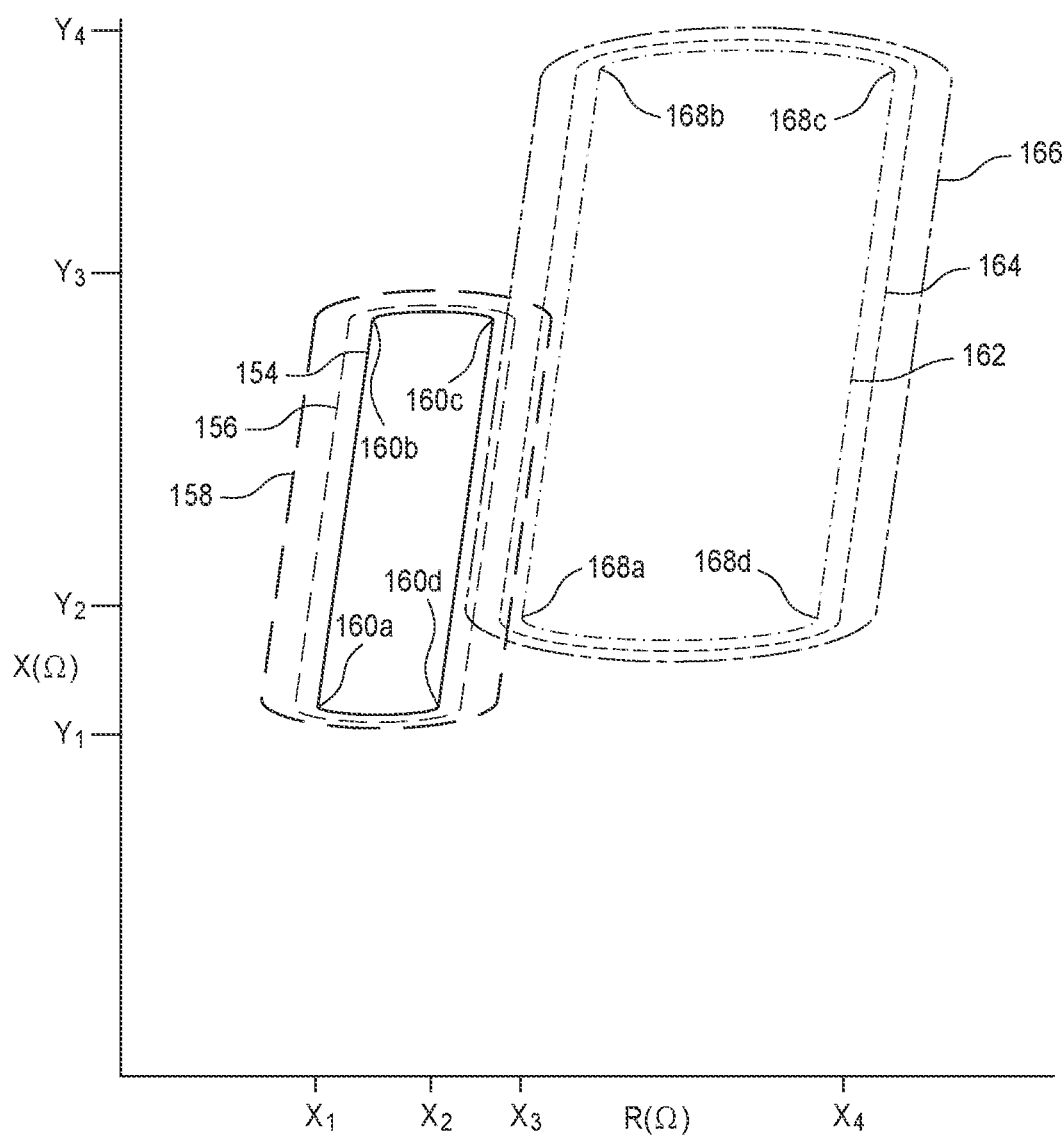
FIG. 9 is a graphical representation of the electrical response of a switchable match hereof.

In the switchable match 102 of FIG. 1, the capacitance between or across the high voltage bus 132 and the return or ground bus 134 is the sum of the capacitances of the capacitors 150a-d connected between or across the high voltage bus 132 and the return or ground bus 134. The value of the shunt capacitance, which is the sum of the individual capacitance values of the capacitors 150a-d switched into the match circuit to be electrically connected between or across the high voltage bus 132 and the ground or return bus 134, is adjusted to maximize the power transfer into the process chamber component or the plasma coupled thereto, i.e., into the load, even when the relative resistance and reactance of the load changes. Referring to FIG. 9, the effect on matching using this methodology is represented for the switching of up to two shunt capacitors, for example capacitors 150a, b, into or out of the match circuit.

In FIG. 9, the effective power coupling or transfer into the load, in comparison to the shunt capacitance value, the resistance and the reactance of the load is shown by way of an example of two capacitances, C. Here, the shunt capacitance is based on the sum of the capacitances of fixed capacitance capacitors, here for example capacitors 150a, b, switched into the match circuit as shunt capacitors. Herein, fixed means the rated or actual value of the capacitance of a capacitor at a set of conditions, for example at 20° C. and atmospheric pressure, it being understood that the capacitance of a such a capacitor can drift slightly based on the operating conditions and age thereof. However, the capacitance is fixed in the sense that the capacitor cannot be intentionally manipulated to controllably change the capacitance thereof, which is done with variable capacitors. In FIG. 9 the Y-axis represents the load reactance, and the X-axis represents the load resistance. During processing in the process chamber, both the reactance and the resistance of the load can change, which can affect the percentage or amount of the power leaving the RF amplifier that actually passes into and through the load, for example a process chamber component or a process chamber component electrically coupled to a plasma in the chamber. Line 154 circumscribes a region of a range of resistance and the reactance of the load where, if only a single capacitor $C_1$, for example only capacitor 150a, is switched into the match circuit between or across the high voltage bus 132 and the return or ground bus 134, no power (or a minimum amount of power) will be reflected by the load. In other words, within the reactance X and resistance R values of the load bounded by points 150a-d, if capacitor 150a is the only capacitor switched into the match circuit between or across the high voltage bus 132 and the return or ground bus 134, 100% (or the maximum possible) of the power leaving the RF amplifier will reach the load. Additionally, as the reactance and resistance of the load can change dynamically during use of the load, for example the load as an electrode and plasma in a plasma circuit, greater power will begin to be reflected by the load once the values of the resistance R and reactance X are outside of the area circumscribed by the line 154. For example, line 156 represents the series of values of the load resistance R and reactance X where 10% of the power will be reflected by the load where only capacitor 150a is switched into the match circuit. In other words, where 90% of the power leaving the RF amplifier 114 is passed into the load. Likewise, line 158 represents the series of values of resistance R and reactance X where 20% of the power will be reflected by the load where only capacitor 150a is switched into the match circuit. In other words, where 80% of the power leaving the RF amplifier 114 is passed into the load. Although not shown, the further the resistance R and reactance X values of the load are outside of the area circumscribed by line 154, with only capacitor 150a switched into the match circuit, the higher the reflected power percentage, and the lower the percentage of the power leaving the RF amplifier reaching the load.

Because the drift of the resistance and the reactance of the load cannot be directly controlled while the process chamber is in use, if only a single fixed capacitance capacitor could be switched into the match circuit between or across the high voltage bus 132 and the return or ground bus 134, the percentage of power transferred into the load could deteriorate significantly. However, here, a second fixed capacitance capacitor, for example capacitor 150b, can be additionally switched into the match circuit between or across the high voltage bus 132 and the return or ground bus 134. Capacitor 150b can be switched into the match circuit in addition to capacitor 150a, or it can be switched into the match circuit while capacitor 150a is switched out of the match circuit. In this case, the match circuit will match a different range of values of resistance R and reactance X of the load. However, it is also possible to select the values of the capacitors 150a, b, so that the ranges of resistance R and reactance X matched and allowing 100% or the greatest possible transmittance of power to the load by using only capacitor 150a, and those matched and allowing 100% or the greatest possible transmittance of power to the load using both capacitors 150a and 150b, can overlap. Likewise, the capacitances can be selected so that the ranges of resistance R and reactance X matched and allowing 100% or the greatest possible transmittance of power to the load by using only capacitor 150a or only capacitor 150b overlap. For example, in FIG. 9, curve 162 circumscribes the values of resistance and reactance within which 100% (or the greatest possible amount) of the power leaving the RF amplifier is transferred into the load when both capacitors 150 and 150b are switched into the match circuit between or across the high voltage bus 132 and the return or ground bus 134. Line 164 represents the series of values of resistance r and reactance X where 10% of the power will be reflected by the load where both capacitor 150a and capacitor 150b is switched into the match circuit. In other words, where 90% of the power leaving the RF amplifier 114 passed into the load. Likewise, line 166 represents the series of values of resistance r and reactance X where 20% of the power will be reflected by the load where capacitor 150a and capacitor 150b is switched into the match circuit. In other words, where 80% of the power leaving the RF amplifier 114 passes into the load. Here, it can be seen that there are regions of overlap where the percentage of power reaching the load is in the same percentile range when either only capacitor 150a, or both of capacitors 150a and 150b, are switched into the match circuit.

By properly selecting the values of the capacitors, it is possible to create a match in which the reflected power can reach a maximum desired value of $P_r$ acceptable to the application occurring in the process chamber. For example, by reducing the value of the capacitances of capacitor 150a and 150b to slightly less than the value for the results shown in FIG. 9, the area circumscribed by curve 162 will shift to the left and downwardly, i.e., to lower X and R values, such that there will be ranges of resistance R and reactance X where the match will pass 100% (or the greatest possible amount) of the power to the load using either capacitor 150 a or b alone, or capacitors 150a and 150b together. Likewise, where the sum of the capacitances of capacitors 150a and 150b is greater than the value represented in FIG. 9, the regions of 100% (or the greatest amount possible of) power transfer circumscribed by lines 154 and 162 will be further apart, and regions of lower power transfer, i.e., greater reflectance, will be present therebetween. Additionally, a region of 100% transmittance and corresponding lower transmittances surrounding the 100% (or greatest possible power transfer) region is present having higher X and R values than that of curve 162, which is created by switching a third capacitance such as capacitor 150c into the match circuit as shown by Curve 170 in FIG. 10. Likewise a region of 100% (or greatest possible power transfer) and corresponding lower transmittances surrounding the 100% region is present having yet higher X and R values than that of curve 162, which is created by switching a fourth capacitance such as capacitor 150c into the match circuit as shown by curve 172 of FIG. 10.

The shunt capacitance provided by selectively switching capacitors 150a-d into or out of the match circuit allows up to 16 different shunt capacitances can be present in the match circuit. Assuming the capacitance values of the capacitors 150a-d are A, B, C and D respectively, the following total shunt capacitance values, i.e., the capacitance between or across the high voltage bus 132 and the ground or return bus 134, are possible: 0 (none of capacitors 150a-d are switched into the circuit), A, B, C, D, A+B, A+B+C, A+B+C+D, A+C, A+C+D, A+B+D, A+D, B+C, B+C+D, B+D, C+D. The total number of different capacitance values which can be present between the high voltage bus 132 and the ground or return bus 134 is $2^c$, where C is the total number of capacitors which are available to be switched into or out of the match circuit between the high voltage bus 132 and the return or ground bus 134. Thus, with only two capacitors 152a, b present, four shunt capacitances can be achieved. With three capacitors 152a-c present, eight capacitances can be expressed. The number of capacitors, and their values, are a matter of design choice for the match designer, depending on the desired range of X and R-values to be matched for high transmittance, and the desired overlap of the 100%, 90%, 80% etc. transmittance regions of each capacitance which can be established. The capacitance values of the capacitors 152a-d can be different than each other, for example where A is less than B, B is less than C, and C is less than D, The capacitance values of each capacitor 150a-d may be the same. Some of the capacitors 150a-d may have the same capacitance value, while others have different capacitance values. The capacitance values are selected to allow the switchable match provide the closest match possible to pass the highest amount of forward power to the load, based on the likely or calculable properties of the load.

Figure 11:
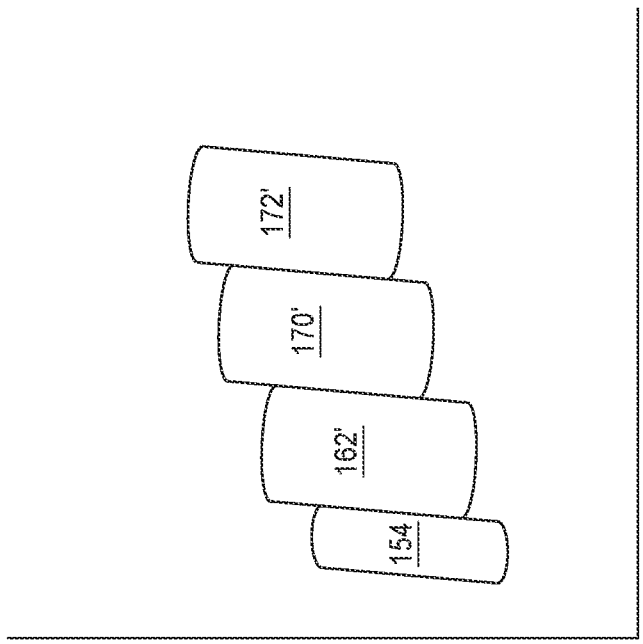
FIG. 11 is an additional graphical representation of the electrical response of a switchable match hereof.
Figure 10:
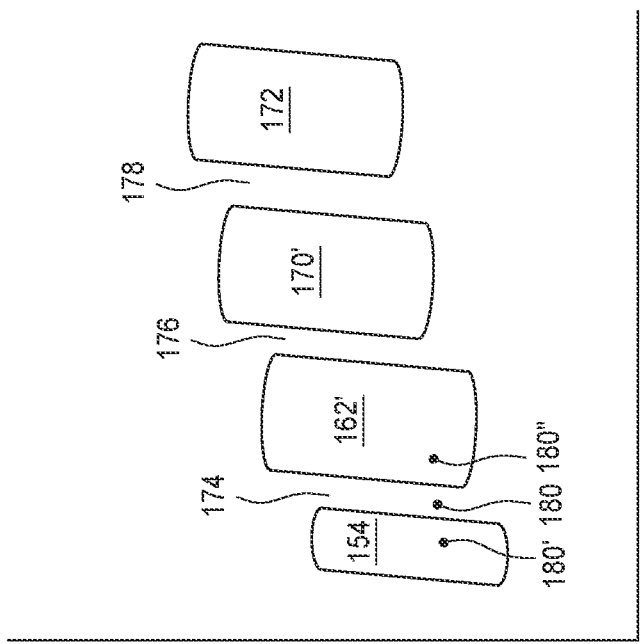
FIG. 10 is an additional graphical representation of the electrical response of a switchable match hereof.

Referring to FIGS. 10 and 11, the regions of load properties of resistance R and reactance X matched by four different total shunt capacitances is shown. Each region may represent the values or resistance R and X of the load where 100% transmittance (or the greatest possible transmittance) of the forward power to the load for a single one of the capacitors 150a-d switched into the match circuit, or one of four different combinations thereof. In FIG. 10, the regions of pairs of reactance X and resistance R values circumscribed by line 154 representing the presence of only capacitor 150a of the same value as that shown in FIG. 9 in the match circuit, and regions of pairs of reactance X and resistance R values circumscribed by line 154 representing both capacitor 150a and 150b of the same value as that of FIG. 9 in the match circuit, are shown. Additional curves, for example a third curve 170 circumscribing a region of pairs of reactance X and resistance R values where 100% transmittance to the load occurs using three of the capacitors 150a-d, or a different combination thereof, for example the first and third capacitors 150a, c are switched into the match circuit, and a fourth curve 172 circumscribing a region of pairs of reactance X and resistance R values where 100% transmittance to the load occurs using different combinations of the four capacitors 150a-d switched into the match circuit, are shown. In FIG. 10, the regions of pairs of X and R values where 100% (or the greatest possible) transmittance occurs are spaced from one another, such that switching these four combinations of capacitors 150a-d in the match circuit results in operation of the match where power (or an amount greater than the minimum possible) will be reflected by the load where the R and X values of the load are not within a region circumscribed by one of curves 154, 162, 170 and 172. This will occur when the load reactance and resistance values are outside of the regions circumscribed by the lines 154, 162, 170 and 172, for example in the regions 174, 176 and 178 therebetween. Thus, as the electrical characteristic load values change, a portion of, or greater than a minimum possible amount of, the power being supplied to the process chamber 122 or component thereof will be reflected, the value thereof as a percentage of forward power from the RF amplifier 114 depending upon how close together are the regions circumscribed by the curves or lines 154, 162, 170 and 172. The greater the distance therebetween, the greater the percentage of the power reflected from the load when operating in these regions. However, this may be acceptable operation for certain applications.

Alternatively, the values of the capacitors 150a-d or the combinations thereof can be modified, such that the combinations thereof can result in overlapping regions of pairs of reactance X and resistance R values where 100% transmittance to the load occurs. Here, the resulting curves 162', 170' and 172' resulting from reducing the capacitance values of the capacitors 150b-d combined into the match in FIG. 10 to lower values, resulting in the resulting regions of 100% match moving to lower resistance R and reactance X values, such that the boundaries of the regions of 100% transmittance are at least coexisting, if not overlapping, in the R value direction. As a result, there is a large region of pairs of reactance X and resistance R-values where 100% transmittance to the load occurs, which is continuous and is without regions of reflection.

For convenience, FIGS. 10 and 11 show the regions of pairs of reactance X and resistance R values where 100% transmittance to the load occurs for four values of shunt capacitance possible by combinations of switching one or more of the capacitors 150a-d into the match circuit between or across the high voltage bus 132 and the return or ground bus 134 of FIG. 1. However, as discussed previously, the number of shunt capacitance values, and thus the number of regions of pairs of reactance X and resistance R values where 100% (or the greatest possible for the match) transmittance to the load occurs is $2^c$, where C is the number of capacitors available to be switched into the match circuit between or across the high voltage bus 132 and the return or ground bus 134. Thus, the match designer has a high degree of freedom to design a match having multiple ranges of 100% (or minimum possible) reflected power, to match the power driving circuit with the load.

Switches 152a-d, each configured to incorporate or switch the corresponding one of capacitors 150a-d into the match circuit between or across the high voltage bus 132 and the return or ground bus 134, are configured as solid state PIN diodes. This allows the switches 152a-d to switch under load, i.e., while the power is being driven at least through the high voltage bus 132, and where at least one of capacitors 152a-d is switched into the match circuit, through the remainder of the switchable match circuit 102 and into the load, to allow continuous uninterrupted power supply into the load, i.e., into the process chamber 122 or a component thereof.

Here, the DC to AC convertor is capable of variable frequency output, i.e., of controllably changing the output frequency thereof. As a result, with the power being supplied to the load, and the switchable match 102 operating to minimize the value of the power reflected by the load, the frequency of the power signal, i.e., the AC frequency value of the power output, can be modified to reduce or change the power reflection value. In the examples of the shunt capacitance between or across the high voltage bus 132 and the return or ground bus 134 shown in FIGS. 9 and 10, where there are values of pairs of load resistance R and load reactance X where reflection of power from the load will occur. Here, the frequency of the power supplied can be adjusted to change the load resistance R and load reactance X at which minimum or no reflection occurs and thereby bring the reflected power value to a lower value or to zero. As shown in FIG. 10, as the load characteristics change, the temporal values of the load resistance R and load reactance X, at the temporal frequency of the power being supplied at a given moment, are values between the switchable capacitance values where the match transmits 100% of the power supplied onto the load. This is represented by point 180, present between the areas of 100% transmittance circumscribed by lines 154, 162. However, by adjusting the frequency of the AC power signal output by the DC to AC converter, either to a greater or lesser value, the location of the resulting pair of resistance R and reactance X values of the load is changed with respect to the regions circumscribed by the curves 154, 162, 170 or 172, to be at either point 180' or 180", within the regions of 100% transmittance. Because the performance of any match is frequency dependent, changing the frequency can be considered to move the resistance R and reactance X values of the load, shift the regions circumscribed by the curves 154, 162, 170 or 172 in the X and R directions, or both. Thus, the switchable match 102, when combined with a variable frequency power supply, here configured as a DC power supply 110, the DC to AC convertor 112 and an RF amplifier 114, the match can be operated to maintain the occurrence of 100% (or maximum possible) transmittance of the power supplied into the load. This is possible even where, as shown in FIG. 10, the switchable match 102 has inherent pairs of values of load resistance R and inductance X where reflected power occurs at a given power frequency where power will be reflected. However, by changing the frequency of the power signal reaching the switchable match, one of the regions of pairs of resistance and reactance values of the load can be adjusted in the R and X directions, or the load values of the resistance R and reactance X changed, such that 100% (or the minimum possible) transmittance to the load occurs.

Referring to FIG. 2, the modularity of the power supply is slightly modified as compared to that of FIG. 1. Here, the RF Amplifier 114 is included in the same box shell 116*x* as the switchable match 102. In all other respect, the power supply system is the same and has the same operation as that shown and described with respect to FIG. 1.

Figure 3:
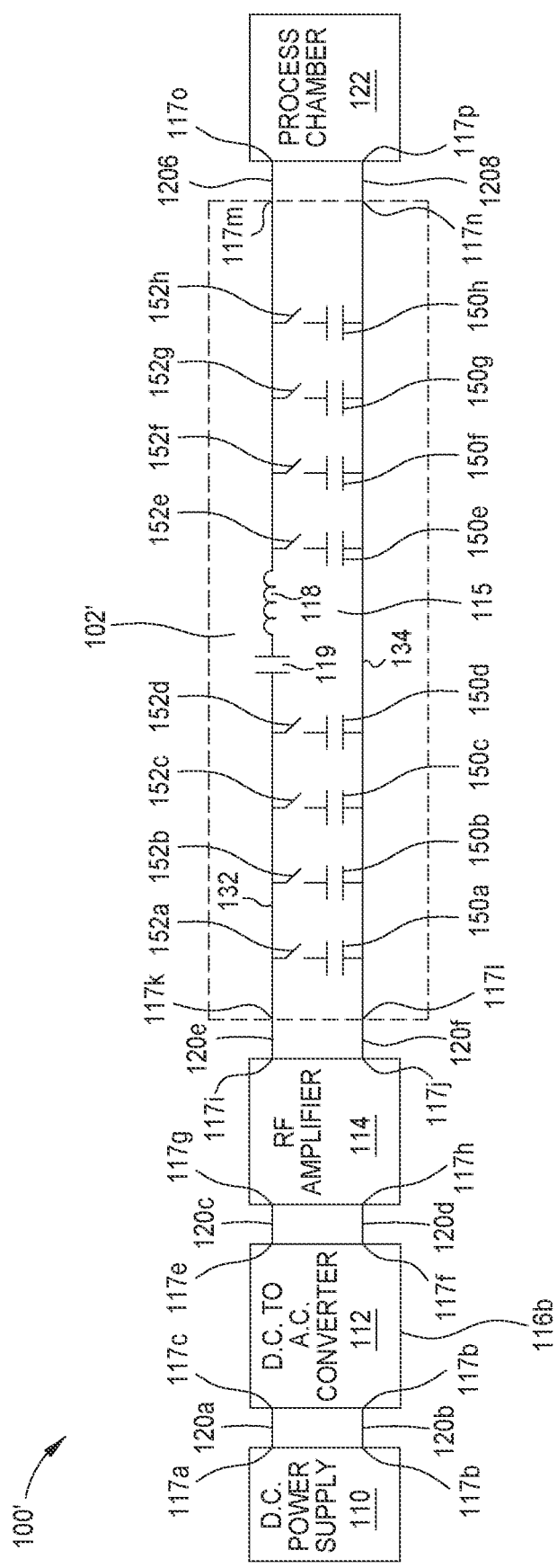
FIG. 3 is a plan view of a plasma power circuit including a switchable match, a DC power supply, a DC to AC converter, and an RF amplifier, the switchable match in a box shell different from that of a DC power supply, a DC to AC converter, and an RF amplifier, for supply of a RF power signal matched to the changing electrical characteristics of a process chamber.
Figure 4:
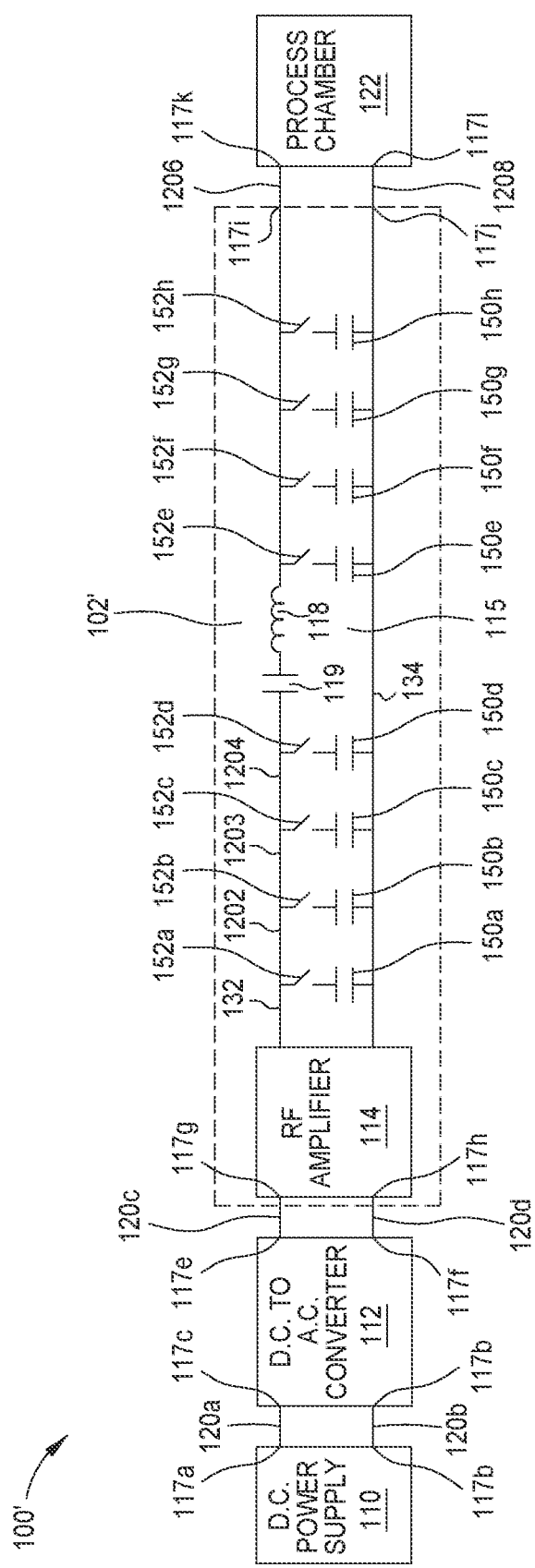
FIG. 4 is a plan view of a plasma power, including a switchable match, a DC power supply, a DC to AC converter, and an RF amplifier, the switchable match disposed in a box shell shared with an RF amplifier, which is a separate box shell from that of a DC power supply and a DC to AC converter, for supply of a RF power signal matched to the changing electrical characteristics of a process chamber.

Referring now to FIG. 3, an additional aspect of the power supply circuit 100 employing a modified switchable match 102' is shown. Here, the modified switchable match 102' is configured as a pi (π) switchable match circuit 102', configured with two sets of capacitors 150*a-d* and 152 *e-h* and corresponding switches 152*a-d* and 152*e-h* configured to selectively connect a capacitor 150*a-h* electrically connected thereto in series between or across the high voltage bus 132 and the return or ground bus 134. Here, an inductor 119 and a capacitor 118 are interposed in series in the high voltage bus 132 between the area of the high voltage bus 132 where capacitors 150*a-d* can be connected by thereto by switches 152*a-d* and the area of the high voltage bus 132, between the inductor 119 and capacitor 118 and the process chamber 122, where capacitors 150*e-h* can be connected by switches 152*e-h* to the high voltage bus 132. Here, each leg of the pi (π) match 102', i.e., the portions thereof to either side of inductor 119, includes four fixed capacitance capacitors 150*a-d* or 150 *e-h*, each selectively connectable or not connectable between or across the high voltage bus 132 and the return or ground bus 134 of the switchable pi (π) match 102'. A lesser number, but at least two such capacitors 150 and corresponding switches 152 to switch them into or out of the match circuit are present on at least one leg of the switchable pi (π) match 102'. The modular construct of the power supply circuit 100' of FIG. 3 corresponds in structure to the power supply circuit 100 of FIG. 1, but for the substitution of the switchable pi (π) match 102' for the L style matching configuration of the power supply circuit of FIG. 1. Likewise, the modularity of the power supply circuit 100' of FIG. 4 corresponds in structure to the power supply circuit 100 of FIG. 2, but for the substitution of the switchable pi (π) match 102' for the L style-matching configuration of the power supply circuit 100 of FIG. 2.

The pi (π) switchable match circuit 102' of the power supply circuit 100' of FIGS. 3 and 4 has similar operating characteristics as the L style-matching configuration of the power supply circuit of FIG. 1, in terms of matching. Here, when none of capacitors 150*e-h* are switched into the match circuit as shunt capacitors, the power supply circuit 100 of FIG. 3 corresponds in structure to that of FIG. 1. Where none of the capacitors 150 *e-h* of the pi (π) match 102' are switched into the shunt capacitance between or across the high voltage bus 132 and the return or ground bus 134, match 102' has the same performance characteristics as the L style switchable match 102 of FIGS. 1 and 2 where the capacitance of the fixed capacitors 125*a-d* is the same as the values thereof in FIGS. 1 and 2. Similarly, disconnecting the capacitors 150*a-d* from the match circuit while switching one or more of the capacitors 150*e-h* into the match circuit and across or between the high voltage bus 132 and the return or ground bus 134 will result in similar performance characteristics to those of the switchable match of FIGS. 1 and 2 where the capacitance of the fixed capacitors 125*a-d* is the same as the values thereof in FIGS. 1 and 2. The switching of capacitors from the group of fixed capacitors 150*a-d* on one side of inductor 119 into the match circuit of the switchable pi (π) match 102' and thus across or between the high voltage bus 132 and the return or ground bus 134, in addition to the switching of capacitors from the group of fixed capacitors 150*e-f* on the other side of inductor 119 into the match circuit of the switchable pi (π) match 102' and thus across or between the high voltage bus 132 and the return or ground bus 134, results in a combined effect of the two sets of parallel shunt capacitors similar to that shown and described with respect to FIGS. 9 to 11. This, with the addition of varying of the output frequency of the DC to RF converter, enables a match designer to design a match having minimal pairs of load resistance r and reactance X where the match does not result in 100% transmittance of the power supplied into the power supply circuit 100 into the load. For example, where the load, at the temporal, i.e., the current in time, output frequency of the DC to AC convertor 112, presents resistance R and reactance X values which are not fully matched to prevent reflection of the power at that frequency, the DC to AC convertor can change its frequency upwardly or downwardly to adjust the characteristics of the match and the load to result in no or minimal reflectance of power by the load. Additionally here, each of switches 152 *a-h* has the same or similar configuration as the switches 152*a-d* of FIGS. 1 and 2, preferably configured as solid state PIN diodes capable of hot switching, i.e., switching under load or full power application. As a result, like the power supply circuit 100 of FIGS. 1 and 2, in the power supply circuit 100' incorporating a switchable pi (π) match 102' each and any of the capacitors 152 is switchable into or out of the match circuit, and between or across the high voltage bus 132 and the return or ground bus 134, under full power without the need to disconnect the switchable pi (π) match 102' from the RF amplifier or the load, and thus continuous matching of the load, even as the load resistance R and reactance X characteristics change, is accommodated. As a result, the maximum forward power, i.e., the minimal reflected power, is accommodated by selectively switching ones of capacitors 150a-h into or out of the shunt capacitance (the capacitance between the high voltage bus 132 and the return or ground bus 134) and simultaneously, as necessary, adjust the output frequency of the DC to AC convertor to maintain the maximum forward power transmittance into the load, here the process chamber, including a component thereof or a component thereof electrically coupled to a plasma therein, can be maintained.

Referring to FIGS. 7 and 8, the use of the power supply circuits 100, 100' of FIGS. 1 to 4 hereof can be used modularly, in other words, a single DC to AC generator can be coupled to multiple process chambers 122 through multiple switchable matches 102, 102', each switchable match 102 or 102' configured for matching to a single such process chamber or component therein.

Figure 12:
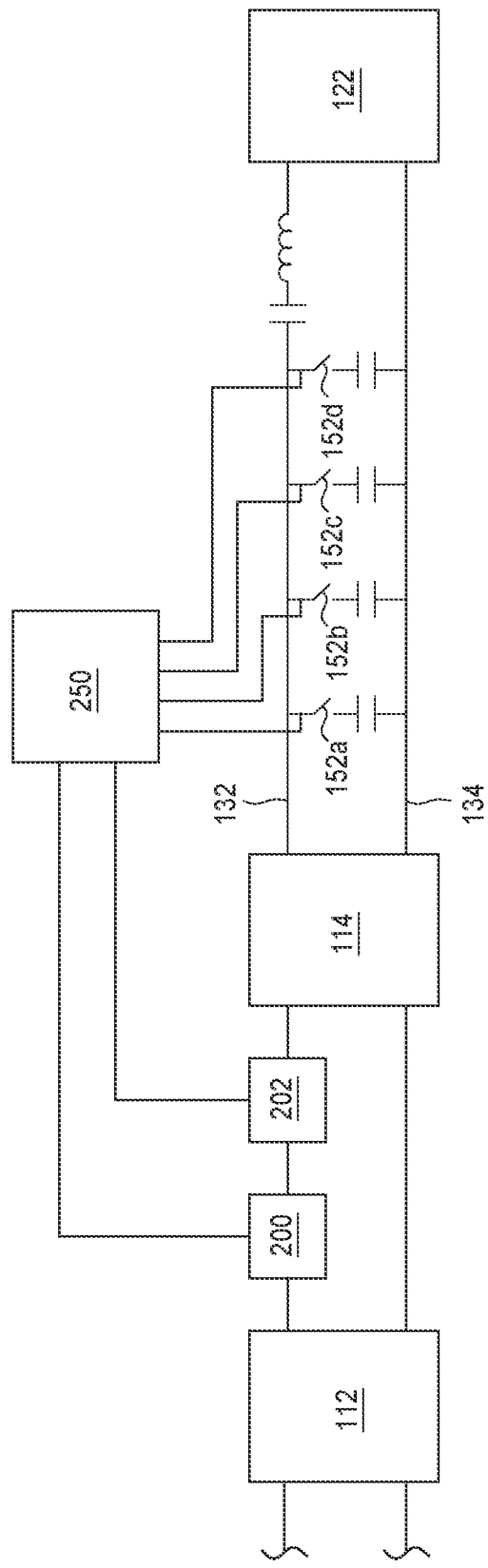
FIG. 12 is a schematic of a control circuit for the power supply circuits hereof.

FIG. 7 schematically shows a distributed power supply system, where the output of a single DC power supply 110 is connected to the input of multiple DC to AC convertors 112, one such AC to DC convertor 112 provided for each process chamber to be powered using the single DC power supply 110. Here, four process chambers 122a-d are ultimately connected to a single DC power supply 110, but a greater of lesser number of process chambers 122 can be powered by a single DC power supply 110. Each process chamber 122a-d is coupled to a switchable match 102 or 102', each switchable match 102 or 102' is coupled to a dedicated RF amplifier 114, and each RF amplifier is coupled to a dedicated DC to AC converter 112. Although here the RF (AC) amplifier 114 and the DC to AC convertor 112 are shown as separate components, they may be combined into a single RF stage coupled to the DC source, i.e., to the DC power supply 110 as shown in FIG. 12. Again, as in each embodiment hereof employing the DC source 110, the DC source 110 is powered by a source of AC power, for example a fab or factory power main supplying power at a 50 to 60 Hz frequency at for example 200 to 480V. Alternatively, the power source for the DC power supply 110 may be an AC rack configured to supply power to multiple components of a process system, for example a process system employing one or more process regions thereon, and the AC rack is configured to be connected to all of the components of the system requiring un-matched AC power, as well as the DC power supply which converts the AC power input into a DC power output, which is then converted to a desired AC frequency and power level. Here, the output of the DC power supply is connected to each of the four dedicated DC to AC convertors 112, to supply power through the RF amplifiers 114 and the switchable match circuits 102 or 102' and ultimately to chambers 122a, d. Here, each of the DC power Supply 110, DC to AC convertors 112, RF amplifiers 114 and switchable matches 102 or 102' is housed in its own dedicated box shell 116 (FIGS. 1-4), such that the components may be readily switched out or replaced in a power supply circuit 100, 100'. Again, here the DC to AC generator 112 supplies a variable frequency output, to, along with the switching of the capacitors in and out of the shunt capacitance of the switchable match circuit 102, 102', enable a broad range of load combinations of resistance R and reactance X values over which high power delivery with minimal to no reflected power will occur.

Referring to FIG. 8, the power delivery components are configured as those in FIGS. 2 and 4 hereof, wherein the RF amplifier 114 and switchable match 102 or 102' are combined in a single box shell 116, as in FIGS. 2 and 4 hereof. Otherwise, the power supply circuits 100 or 100' of FIG. 8 are the same as those in FIG. 7.

Figure 5:
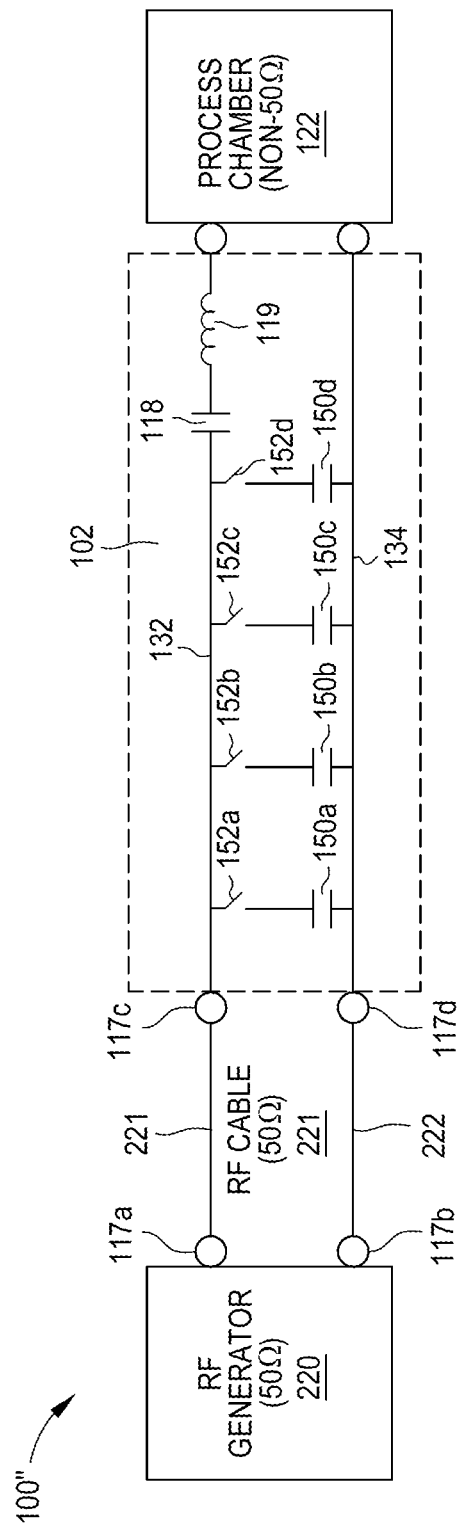
FIG. 5 is a plan view of a plasma power circuit including a switchable match located in series with an RF power supply and an RF cable, for supply of a RF power signal matched to the changing electrical characteristics of a process chamber.

Referring now to FIG. 5, an additional RF power delivery architecture device with switchable match and frequency tuning capability to provide power to a processing chamber, for example a plasma processing chamber, at a consistent value despite changes in the resistance R and reactance X in the process chamber component or environment to which the power delivery architecture device is coupled is depicted. The power supply circuit 100 is here configured to enable connection of one or more switchable matches 102 or 102' to be connected thereto. For example, the resulting power supply circuit 100" can be used to provide high levels of RF power to a process chamber 105 despite the occurrence of changes in the resistance R and reactance X of the load to which the switchable match 102 is connected, for example a process chamber 122 or process chamber component.

Here, power supply circuit 100" includes an RF Generator 220, capable of delivering RF power at a desired amplitude (RMS voltage) and frequencies, which is connected, through cabling (cables 221, 222), to switchable match 102 as previously described with respect to FIG. 1. In this embodiment, the RF Generator is a standard 50-Ω generator 220 contained in a box shell 116a, having a high voltage connector 117a and a return or ground connector 117b extending from a same sidewall thereof. A first 50-Ω cable 221 extends from the connector 117a to the high voltage bus 132 of the switchable match 102, and a second 50-Ω cable 222 extends from connector 117b to the return or ground bus 134 of the switchable match. Here, switchable match 102 l configured as, and operates in the same manner as, the switchable match of FIGS. 1 and 2 hereof. Return or ground bus 134 of the switchable match 102 extends through the match to be connected to a return or ground connection on the process chamber 122, and high voltage bus 132 extends across four switch connection locations and to a in line capacitor 119 and inductor 119 in series therewith, and thence connects to the high voltage side of the process chamber 122.

In this embodiment, a single RF Generator 220 is dedicated to a single process chamber 122. As with the embodiments of FIGS. 1 and 2 hereof, switchable match 102 is operable to selectively switch one or more of the fixed capacitance capacitors 152a-d into the shunt capacitance between or across the high voltage bus 132 and the return or ground bus 134, to modify the matching characteristics of the switchable match 102 to accommodate multiple discrete ranges of pairs of process chamber 122 or process chamber component or component and plasm resistance R and reactance X values. As a result, over a broad range of process chamber 122 or process chamber component resistance R and reactance X values, the switchable match 102 will provide low to no reflected power at the process chamber, i.e., it will provide a complete, or nearly complete match, to transmit 100%, or nearly 100% of the power output of the RF generator into the load (the process chamber or process chamber component). Additionally, in ranges of process chamber 122 or process chamber component or component and plasma resistance R and reactance X values where the switchable match 102 does not provide the highest possible transmittance (minimum reflection), the RF generator 220 is configured as a variable frequency RF generator 220, such that the output frequency of the power signal thereof can be adjusted to cause the switchable match 102 to closer approximate the load, and obtain as a result the maximum power transmittance into the load, for example 100% power transfer.

Figure 6:
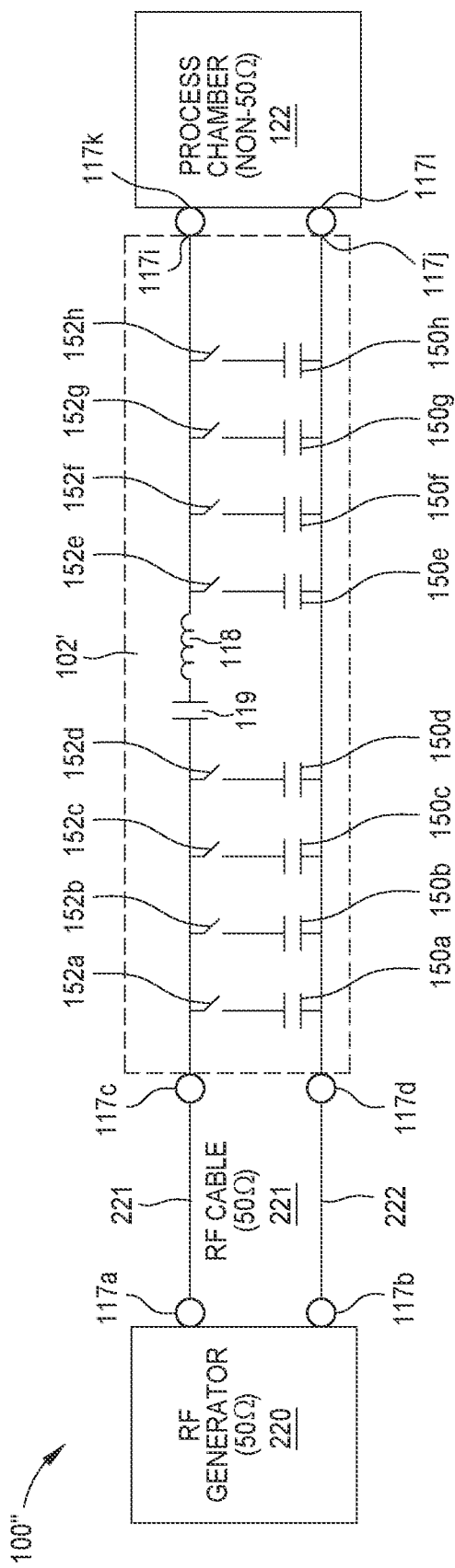
FIG. 6 is a plan view of a plasma power circuit including a switchable match located in series with an RF power supply and an RF cable, for supply of a RF power signal matched to the changing electrical characteristics of a process chamber.

Referring to FIG. 6, another RF power delivery architecture device with switchable match and frequency tuning able to provide power to a plasma chamber at a consistent rate despite reactance changes in the reactance and resistance of the load is shown. In FIG. 6, the RF generator 220 and RF cabling 221, 222 are employed, but the pi architecture switchable match circuit 102' is substituted for the L architecture switchable match of FIG. 5. In all other respects, the power deliver circuit is the same.

The system hereof includes a controller to select the appropriate once of fixed capacitors 150a-d or 150a-h to be switched into the shunt capacitance, in consideration of the reflected power and the power signal frequency. Here, the circuit element supplying the AC frequency, such as an RF frequency, includes therein circuitry to measure the power output by the frequency generating circuit element, also known as the forward power analyzer 200, and also the reflected power arriving back at the output terminals of the frequency generating circuit element using a reflected power analyzer 202, each electrically interposed in the high voltage connection between the AC to DC convertor 112 and the RF Amplifier 114, or incorporated into one of these components or within the RF generator of FIGS. 5 and 6. Here, the frequency generating circuit is one of the DC to AC convertor 112 of FIGS. 1 to 4, or the RF Generator 220 of FIGS. 5 and 6. Using the RF Generator 220 as an example, the generator includes a comparator circuit to compare the quantities of the reflected power as a percentage of the forward power or a ratio of the power reaching the load (forward power minus reflected power) to the forward power, and a logic controller configured to change the output frequency of the RF Generator 220 to obtain the highest ratio of percentage possible. This also consider that it may not be possible to achieve 100% transmittance of the forward power into the load, but that a maximum transmittance represented by the highest ration or percentage of power reaching the load to the forward power is the desired outcome of frequency tuning of the RF Generator 220. Based on the relative percentages or the ratio, the generator changes the output frequency thereof under control of the logic controller to determine the optimal temporal (at that immediate moment in time) percentage or ratio, representing the lowest reflectance and highest transmittance of the forward power into the load. The RF generator may frequency tune autonomously, i.e., independently of any other control element for the circuit.

Additionally, a controller 250 is provided, and is configured to control the operational settings of the PIN Diode switches 152, to selectively include a capacitor in the shunt capacitance of the match circuit. The controller 250 includes a logic device, for example, a field programmable array, a microcomputer, or the like, into which the characteristics of the operational ranges of the switchable match 102 or 102' are programmed or set. For example, the controller may be a recipe controller used to select a recipe, i.e., a series of RF or AC powers and frequencies delivered to the plasma electrode or other component of the chamber, as well as the substrate support temperature, spacing between the electrode and the substrate, the gas mixture in the chamber environment, and other process variables that can be controlled or selected. Specifically, for a given process chamber, a match designer, with knowledge of the likely ranges or resistance and reactance of the load to which the match is to be connected, for example, a process chamber component or a process chamber component and a plasma electrically connected thereto, determines a set of desired discrete shunt capacitance values at which high transmittance of power to the load, and thus low reflectance from the load, will occur. Additionally, the designer programs the controller 250 to select the switches, among switches 152a-d or 152a-h, which need be in the closed position to cause the capacitor connected thereto to be a part of the shunt capacitance of the switchable match 102 or 102'. Throughout, shunt capacitance is the total capacitance value between or across the high voltage bus 132 and the return or ground bus 134 of the switchable match 102 or 102'. This value is the sum of the fixed capacitance of all capacitors 150 connected between or across the high voltage bus 132 and the return or ground bus 134 of the switchable match 102 or 102'. The designer may then operate the load, i.e., here operate the chamber 122 in its normal working environment or conditions, to determine the actual reflected power therefrom, and the resulting pairs of values of resistance R and reactance X of the load where high transmittance (low reflection) and relatively lower transmittance (high power reflection) are occurring. With this information, the designer can modify the capacitance values of the fixed capacitance capacitors 150 potentially switched into the shunt capacitance. Then the designer or user can map the regions of pairs of values of resistance R and reactance X within which the highest transmittance (lowest reflection) is present between the power supply circuit and the load for each potential or actual shunt capacitance, to yield the results shown in FIGS. 9 to 11, for the RF Generator 220 or DC to AC convertor 112 nominal output frequency, for example a non-zero integer multiple of 13.56 KHz, for example 27.12 MHz, as well as for the maximum and minimum variation of these frequencies of the generator or converter about the output frequency. As a result, the designer can determine the matching characteristics of the power supply circuit 100, 100' or 100", when coupled to the load, including whether, within the range of shunt capacitance values achievable by selectively switching one or more of the capacitors 150a-d or 150 a-h (FIG. 6) into the shunt capacitance, in conjunction with the potential output frequency values of the RF Generator 220 or DC to AC convertor 112, where the match will adequately perform for its intended purpose. This may include operation points where less than the maximum possible transmittable power is reaching the load, or may include no operating points where this occurs.

The ranges of power transmittance versus the load resistance R and reactance X values are then programmed into the controller 250, and the controller 250 monitors the identity of the fixed capacitance capacitors 150a-d or 150a-h switched into the match circuit and thus the operational state of the match. In one aspect, if the ratio of reflected power to forward power begins to increase, or the ratio of forward power to reflected power begins to decrease, the RF Generator 220 or DC to AC convertor 112 automatically changes the output frequency of the power signal to again obtain the maximum forward power reaching the load, i.e., the highest possible power transmittance. The controller 250 monitors the RF Generator or DC to AC convertor 112 output frequency. If this change in frequency still results in a less than possible or desirable transmittance of power into the load (excess reflectance), then, based on the RF Generator 220 or DC to AC convertor 112 output frequency, and the known setting of the switches 152 and thus the identity of the fixed capacitance capacitors 150 currently in the shunt capacitance, the controller 250 signals one or more of the switches 152 to change their operational settings while power is being supplied to the load by the RF Generator 220 or DC to AC Convertor 112, and thereby change the shunt capacitance to a value which, for the current operating conditions including the load conditions, will result in a higher power transmittance and preferably the highest possible transmittance. The controller continuously monitors the forward power, the reflected power, and the RF Generator 220 or DC to AC Convertor 112 output frequency, to control the switches 152 and thus establish the shunt capacitance value leading to the highest possible power transmittance.

In another aspect, the controller can be programmed to select the switches 152 a-d or 152a-h to be closed to include one or more of fixed capacitance capacitors 150a-d or 150 a-h into the shunt capacitance of the match circuit, based on the process recipe run in the chamber or process environment. Here, the system designer determines, based on prediction or actual data, the reactance and resistance values of the load during each process step, selectively switched capacitors 150a-d or 150 a-h into the shunt capacitance and measures the reflected power, or both, to determine the appropriate capacitance of the fixed capacitance capacitors 150a-d or 150 a-h to be switched into the shunt capacitance to minimize the reflectance at each process step. Here, the frequency of the power supply is controlled solely by the power supply itself.

Figure 13:
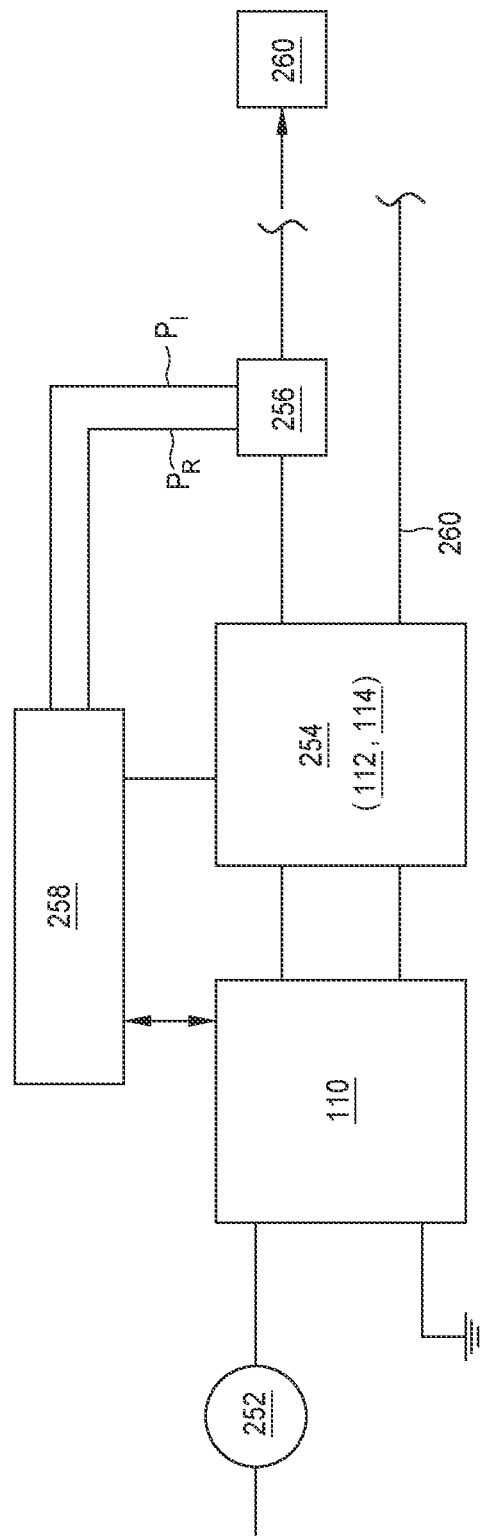
FIG. 13 is a schematic of a power supply circuit incorporating a DC power supply and an RF stage.

FIG. 13 shows a schematic of a power supply circuit incorporating a DC power supply 110, and an RF stage 254, wherein the RF stage combines the DC to AC convertor 112, and AC or RF amplifier 114 of FIGS. 1 to 4 into a single unit. Here, AC power in the range of 200 to 480 V AC is supplied to the DC power supply 110, which converts the AC input into a DV output fed to the RF stage 254. The RF stage include a DC to AC (RF) convertor, and at least one AC (RF) amplifier, as solid-state components thereof. To obtain the desired power output from the RF stage, more than one amplifier may be connected to the output of the DC to AC convertor of the RF stage, and the outputs thereof combined in a combiner (not shown). The AC or RF output of the RF stage 254 passes through a measuring unit 256 wherein the value of reflected power $P_r$ and Pi reflected from the load 260, for example a process chamber component, are measured and transmitted therefrom the a power supply controller 258. The power supply controller 258 is configured to transmit control signals to the DC power supply 110 to change the value of the DV power output therefrom, and to the RF stage 254 to change the output frequency thereof. The power supply controller 258 includes logic to measure the changes in reflected power versus the output frequency of the RF stage, to cause the frequency to be set at a value, which minimizes the reflected power of the load 260. As a result, the frequency of the power can be varied independently of the value of the shunt resistance in the switchable match 102, for example when the shunt capacitance values are based on expected reactance and resistance values of the load based on the process recipe being performed in the process environment to which the load is exposed, or forms a part of.

Herein, a switchable match operable under load, i.e., including hot switching of fixed capacitance capacitors into or out of the shunt capacitance thereof, along with a variable frequency source of AC or RF power, which enables a large range of load resistance and reactance values to be accommodated with minimal reflectance of the forward power by the load, has been described herein.

What is claimed is:
1. A power supply circuit, comprising:
a switchable match configured to change electrical characteristics thereof in response to changes in a load to which the switchable match is connected, the switchable match including:
a high voltage bus connectable to the load;
a low voltage bus connectable to the load such that the load is in series between the high voltage bus and the low voltage bus;
at least two capacitors having a fixed value of capacitance selectively connectable between the high voltage bus and the low voltage bus; and
a plurality of solid state switches equal in number to the number of capacitors having a fixed value of capacitance connectable between the high voltage bus and the low voltage bus, each switch configured and arranged to selectively connect or disconnect one of the capacitors having a fixed value of capacitance selectively connectable between the high voltage bus and the low voltage bus into electrical communication between the high voltage bus and the low voltage bus; and
a variable frequency power supply circuit including a variable frequency power supply operatively connected to a high voltage output connection, the high voltage output connection connected to the high voltage bus,
wherein the switchable match is configurable to include:
a first fixed capacitance, comprising the sum of the capacitances of one or more of the fixed capacitance capacitors, electrically connected between the high voltage bus and the low voltage bus, and, with the first fixed capacitance electrically connected between the high voltage bus and the low voltage bus, the switchable match is configured to transmit a greater percentage of a power transmitted thereto by the variable frequency power supply to the load connected thereto over a first range of resistance and reactance values of the load and a lesser percentage of the power transmitted thereto by the variable frequency power supply to the load connected thereto over a second range of resistance and reactance values of the load; and
a second fixed capacitance, comprising the sum of the capacitances of one or more of the fixed capacitance capacitors different than those providing the first capacitance, electrically connected between the high voltage bus and the low voltage bus, and, with the second fixed capacitance electrically connected between the high voltage bus and the low voltage bus, the switchable match is configured to transmit a greater percentage of the power transmitted thereto by the variable frequency power supply to the load connected thereto over a third range of resistance and reactance values of the load different from the first range and a lesser percentage of the power transmitted thereto by the variable frequency power supply to the load connected thereto over a fourth range of resistance and reactance values of the load.

2. The power supply circuit of claim 1, wherein the variable frequency power supply circuit comprises a DC power supply and a variable frequency output DC to AC Convertor.

3. The power supply circuit of claim 2, wherein the variable frequency power supply circuit further includes an amplifier.

4. The power supply circuit, of claim 1, wherein the variable frequency power supply is an RF generator.

5. The power supply circuit of claim 1, wherein the switchable match is configured as an L match.

6. The power supply circuit of claim 1, wherein the switchable match is configured as a π match.

7. The power supply circuit of claim 1, wherein the ranges of resistance and reactance of the load of the second range and the fourth range overlap.

8. The power supply circuit of claim 1, wherein the ranges of resistance and reactance of the load of one of the first range and the fourth range, and the second range and the third range, overlap.

9. The power supply circuit of claim 1, where the low voltage bus is a ground bus.

10. The power supply circuit of claim 1, wherein the solid state switches are electrically interposed between corresponding ones of the fixed capacitance capacitors and the high voltage bus.

11. A match connectable between a variable frequency power supply circuit and a load, including a variable frequency power supply operatively connected to the load, wherein electrical characteristics of the load dynamically changes, comprising:
a high voltage bus connectable to the load;
a low voltage bus connectable to the load such that the load is in series between the high voltage bus and the low voltage bus;
at least two capacitors having a fixed value of capacitance selectively connectable between the high voltage bus and the low voltage bus; and
a plurality of solid state switches equal in number to the number of capacitors having a fixed value of capacitance connectable between the high voltage bus and the low voltage bus, each switch configured and arranged to selectively connect or disconnect one of the capacitors having a fixed value of capacitance selectively connectable between the high voltage bus and the low voltage bus into electrical communication between the high voltage bus and the low voltage bus
wherein the match is configurable to include:
a first fixed capacitance, comprising the sum of the capacitances of one or more of the fixed capacitance capacitors, electrically connected between the high voltage bus and the low voltage bus, and, with the first fixed capacitance electrically connected between the high voltage bus and the low voltage bus, the switchable match is configured to transmit a greater percentage of a power transmitted thereto by the variable frequency power supply to the load connected thereto over a first range of resistance and reactance values of the load and a lesser percentage of the power transmitted thereto by the variable frequency power supply to the load connected thereto over a second range of resistance and reactance values of the load; and
a second fixed capacitance, comprising the sum of the capacitances of one or more of the fixed capacitance capacitors different than those providing the first capacitance, electrically connected between the high voltage bus and the low voltage bus, and, with the second fixed capacitance electrically connected between the high voltage bus and the low voltage bus, the switchable match is configured to transmit a greater percentage of the power transmitted thereto by the variable frequency power supply to the load connected thereto over a third range of resistance and reactance values of the load different from the first range and a lesser percentage of the power transmitted thereto by the variable frequency power supply to the load connected thereto over a fourth range of resistance and reactance values of the load.

12. The match of claim 11, wherein the switchable match is configured as one of an L match and a π match.

13. The match of claim 11, wherein the ranges of resistance and reactance of the load of the second range and the fourth range overlap.

14. The power supply circuit of claim 11, wherein the ranges of resistance and reactance of the load of one of the first range and the fourth range, and the second range and the third range, overlap.

15. The power supply circuit of claim 11, wherein the solid state switches are electrically interposed between corresponding ones of the fixed capacitance capacitors and the high voltage bus.

16. A method of matching a power supply to a load, comprising:
providing a power supply circuit, comprising:
a switchable match configured to change electrical characteristics thereof in response to changes in the load to which the switchable match is connected, the switchable match including:
a high voltage bus connectable to the load;
a low voltage bus connectable to the load such that the load is in series between the high voltage bus and the low voltage bus;
at least two capacitors having a fixed value of capacitance selectively connectable between the high voltage bus and the low voltage bus; and
a plurality of solid state switches equal in number to the number of capacitors having a fixed value of capacitance connectable between the high voltage bus and the low voltage bus, each switch configured and arranged to selectively connect or disconnect one of the capacitors having a fixed value of capacitance selectively connectable between the high voltage bus and the low voltage bus into electrical communication between the high voltage bus and the low voltage bus;
providing a variable frequency power supply circuit including a variable frequency power supply operatively connected to a high voltage output connection, a high voltage connection connected to the high voltage bus;
providing a first fixed capacitance, comprising the sum of the capacitances of one or more of the fixed capacitance capacitors, electrically connected between the high voltage bus and the low voltage bus, and, with the first fixed capacitance electrically connected between the high voltage bus and the low voltage bus, the switchable match is configured to transmit a greater percentage of the power transmitted thereto by the variable frequency power supply to the load connected thereto over a first range of resistance and reactance values of the load and a lesser percentage of the power transmitted thereto by the variable frequency power supply to the load connected thereto over a second range of resistance and reactance values of the load; and providing a second fixed capacitance, comprising the sum of the capacitances of one or more of the fixed capacitance capacitors different than those providing the first capacitance, electrically connected between the high voltage bus and the low voltage bus, and, with the second fixed capacitance electrically connected between the high voltage bus and the low voltage bus, the switchable match is configured to transmit a greater percentage of the power transmitted thereto by the variable frequency power supply to the load connected thereto over a third range of resistance and reactance values of the load different from the first range and a lesser percentage of the power transmitted thereto by the variable frequency power supply to the load connected thereto over a fourth range of resistance and reactance values of the load.

* * * * *